(12) United States Patent
Noda et al.

(10) Patent No.: US 7,763,223 B2
(45) Date of Patent: Jul. 27, 2010

(54) METHOD FOR MANUFACTURING POROUS SILICA CRYSTAL

(75) Inventors: Shuji Noda, Matsue (JP); Takanobu Shiomura, Matsue (JP); Masahiro Tajima, Matsue (JP); Naoto Imawaka, Matsue (JP); Yasuaki Okamoto, Matsue (JP); Takeshi Kubota, Matsue (JP)

(73) Assignees: Shimane Prefectural Government, Matsue-shi (JP); Shimane University, Matsue-shi (JP)

( * ) Notice: Subject to any disclaimer, the term of this patent is extended or adjusted under 35 U.S.C. 154(b) by 219 days.

(21) Appl. No.: 11/662,059

(22) PCT Filed: Sep. 12, 2005

(86) PCT No.: PCT/JP2005/016769

§ 371 (c)(1),
(2), (4) Date: Jun. 25, 2007

(87) PCT Pub. No.: WO2006/030741

PCT Pub. Date: Mar. 23, 2006

(65) Prior Publication Data

US 2007/0248524 A1     Oct. 25, 2007

(30) Foreign Application Priority Data

Sep. 13, 2004    (JP)    ............... 2004-265859

(51) Int. Cl.
*C01B 33/12* (2006.01)
*C30B 28/00* (2006.01)
*B01D 9/02* (2006.01)

(52) U.S. Cl. ............ 423/335; 23/295 R; 23/300; 23/301; 117/66; 117/71

(58) Field of Classification Search ............... 423/335; 117/66, 71; 23/295 R, 300, 301
See application file for complete search history.

(56) References Cited

U.S. PATENT DOCUMENTS 5,589,153 A * 12/1996 Garces et al. ............... 423/705

FOREIGN PATENT DOCUMENTS

| JP | A-2000-034188 | 2/2000 |
| JP | A-2001-002410 | 1/2001 |

OTHER PUBLICATIONS

S. Shimizu et al., "Synthesis of Giant Zeolite Crystals by a Bulk Material Dissolution Technique", Microporous and Mesoporous Materials, vol. 48, (2001) pp. 39-46.
T. Kida et al., "Synthesis of Large Silicalite-1 Single Crystals from Two Different Silica Sources", Ceramics International, vol. 30, (2004) pp. 727-732.
Gao F et al: "Synthesis of a high-quality host material: Zeolite MFI giant single crystal from monocrystalline silicone slice" Journal of Physical Chemistry B 20011227 American Chemical Society US, vol. 105, No. 51, Dec. 27, 2001, pp. 12704-12708.

* cited by examiner

*Primary Examiner*—Timothy C Vanoy
*Assistant Examiner*—Diana J Liao
(74) *Attorney, Agent, or Firm*—Oliff & Berridge, PLC

(57) ABSTRACT

In a synthetic method for porous silica crystals through a hydrothermal reaction, a method for synthesizing porous silica crystals with a size of 0.5 mm or larger in high reproducibility and efficiency is provided using a method for manufacturing the porous silica crystals, wherein a high concentration area with silicon is formed as a partial area inside a hydrothermal synthesis vessel, and at least a part of a surface-smoothed bulk material is present in the high concentration area with silicon to perform the hydrothermal reaction, the bulk material comprising a compound containing both silicon and oxygen as a supply source for a part or a whole of the structure composition elements of the porous silica crystals.

5 Claims, 2 Drawing Sheets

METHOD FOR MANUFACTURING POROUS SILICA CRYSTAL

TECHNICAL FIELD

The present invention relates to a method for efficiently manufacturing a porous silica crystal as a large-size single crystal.

BACKGROUND ART

Zeolite, known as a compound with a crystalline microporous structure, that is, aluminosilicates represented by the following general formula include cations with a large ion exchange capacity and a three dimensional net-like structure and have a shape and a size of the cavity and channel unique to crystals thereof.

(In the formula, M1 indicates a monovalent cation such as $Na^+$, $K^+$, M2 indicates a divalent cation such as $Ca^{++}$, $Sr^{++}$, and m is equal or smaller than n, and x is indefinite.)

Microporous crystals such as the zeolite, have specific functions such as adsorption action, ion exchange action, as characteristics based on the cavity structure and chemical composition, and are used in application for molecular sieves, cluster encapsulation or catalyst carriers, etc., and in addition to these applications, engineering applications of microporous crystals are being attempted in various fields such as electronic devices and sensors. Porous silica crystals of the present invention are one kind of zeolites and one comprising only silicon and oxygen atoms, in which a typical example is silicalite.

The zeolites have nanosized orderly pores and formation of a semiconductor, electroconductive polymer, etc., within the pores allows to demonstrate quantum specific physical properties as electronic devices and optical devices. When used as a sensor, they can be expected to show high selectivity and high response.

However, zeolites, etc., are generally a few micrometers or less in crystal size, and the crystals thereof are difficult to be arranged in order. When used in semiconductor elements, etc., orderly arrangement of the crystals is important and each of the crystals also has to be similarly sized. In this regard, with zeolites having a crystal size of at least 0.5 mm, preferably a few millimeters, an element having any size and shape with one side of 0.5 mm or more can be easily fabricated.

In a sensor element, a dramatic increase in an absorbtion selectivity can be expected if large crystals having size of 0.5 mm or higher and therefore, having a substantially lower proportion of the outer surface are used, since the smaller the outer surface area showing no absorption selectivity is, the higher the selectivity becomes.

A synthetic method of a large-size single crystal of the porous silica crystals includes one using a bulk material (for example, refer to Patent Document 1). This describes that fused quartz or ceramics, etc., can be used as a bulk material to synthesize a huge crystal with several hundred micrometers or larger through a hydrothermal reaction.

In Patent Document 1, cutouts of fused quartz are used as the bulk material to fill in a pressure resistant vessel to perform the hydrothermal reaction.

Patent Document 1: Japanese Patent Laid-Open No. 2000-34188

DISCLOSURE OF THE INVENTION

The present inventors widely studied manufacturing of a large-size porous silica single crystal through the hydrothermal reaction using fused quartz as the bulk material to find out that the presence of a sharp cut surface in fused quartz leads to a large quantity of micro crystallites and almost no targeted large-size single crystals in the product. For example, in the method described in Patent Document 1, generated crystals are mostly polycrystalline and single crystals are, if any, very small in number. That is, conventional methods for synthesizing a large-size porous silica single crystal provide poor reproducibility and are inefficient in mass production.

An object of the present invention is to solve these problems and provide a method for synthesizing the porous silica crystal with a size of 0.5 mm or larger in high reproducibility and efficiency.

The present invention provides a method for manufacturing a porous silica crystal through a hydrothermal reaction, characterized in that high concentration area with silicon is formed as a partial area inside a hydrothermal synthesis vessel, and the hydrothermal reaction is performed, while at least partial surface of a bulk material is present in the high concentration area with silicon, wherein the bulk material as a supply source for a part or a whole of structure elements of the porous silica crystal comprising a compound including the structure elements, and the surface of the bulk material is smoothed.

The method of the present invention for allowing efficient synthesis of the porous silica crystal in a form of a large-size single crystal suitable for molecular sieves, electronic devices, sensors, etc.

BEST MODE FOR CARRYING OUT THE INVENTION

Figure 1:
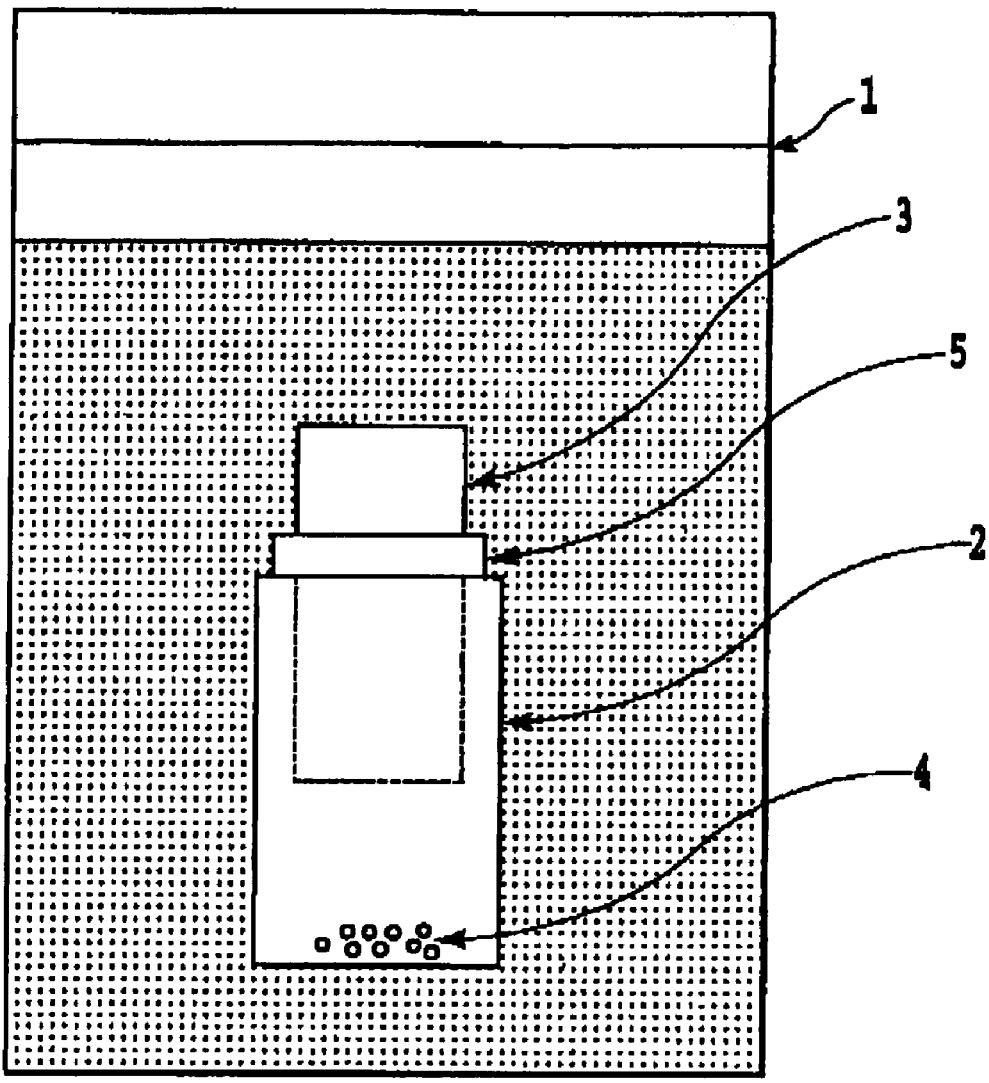
FIG. 1 is a view showing a first embodiment, in which a high concentration area with silicon is formed as a partial area inside a hydrothermal synthesis vessel.

The bulk material in the present invention, differing from fine powder (approximately 10 or less micrometers, generally in order of sub-microns) used as a source of the conventional hydrothermal reaction, indicates a solid with a relatively large size and a smaller specific surface area per unit volume or unit weight. The bulk material serves as a base substrate for growth of the porous silica crystal and a supply source for a crystal composition.

This bulk material has to have a size enough to avoid that all of the bulk material is dissolved in the reaction solution. When the bulk material is completely dissolved, only a block of microcrystals are formed on the bottom of a vessel and a large-size single crystal cannot be obtained, since the large-size porous silica single crystal grows on a surface of the bulk material. Therefore, the bulk material has to be not only in a size enough to avoid that all of it is dissolved in a solution, but also large enough to support a large-size single crystal. The bulk material can take any shape, and can be used in various forms such as spherical products, crushed aggregates, plate materials, rod or filament materials, and tube materials. There is no upper limit in the size of the bulk material and any size can be used as long as a reaction vessel can accommodate it. The raw material for the bulk material is not particularly limited as long as it includes silica.

The presence of sharp out surface of the bulk material serves as a point of crystal growth and often forms a large amount of porous silica crystals in a polycrystalline form so that the cut surface has to be smoothed. Therefore, the surface-smoothed product is used as the bulk material. This surface smoothing treatment is a treatment to ensure that there are no sharp portions on the cut surface of the bulk material and includes melting treatment, polishing treatment, cutting treatment, etc., but is not limited by these methods as long as the method can smooth the surf ace. Among these surface smoothening treatments, melting treatment is preferably used because it is relatively easy to be used. The most appropriate raw material for the bulk material is fused quartz.

A raw material obtainable by coating a non-silica material with silica can also be used as the bulk material. In this case, the bulk material only serves as a base for crystal growth.

A supply source of the crystal composition may be the bulk material alone, but the whole amount thereof does not necessarily have to be the bulk material, and a supply source other than the bulk material may be contained in addition to the bulk material.

A silica powder raw material such as colloidal silica commonly used in the prior art can be used as such a supply source.

A raw material obtainable by coating a non-silica material with silica can also be used as the bulk material. In this case, since the bulk material only serves as a base for crystal growth, silica powder or silica bulk material has to be separately added.

In the present invention, a high concentration area with silicon has to be formed as a partial area inside a hydrothermal synthesis vessel. This has a purpose to generate a partial supersaturated state to induce a crystal formation.

A method for forming a high concentration area with silicon as a partial area inside the hydrothermal vessel includes one, in which as shown. In FIG. 1, a small vessel 2 is placed inside a hydrothermal synthesis vessel 1 and a bulk material 3 or silica powder raw material is added into the small vessel 2. This is aimed at generating a higher concentration area with silicon inside the small vessel, particularly on the bottom of the small vessel than a whole area inside the reaction vessel by installation of the small vessel to form a double structure. In addition to the use of the double structure, silica powder, etc., with high reactivity may be placed on the bottom of the reaction vessel in a quantity large enough not to be wholly dissolved.

In the present invention, at least a part of the bulk material is present in the thus formed high concentration area with silicon to perform the hydrothermal reaction. In this way, a porous silica single crystal is grown on a surface of the bulk material in a high concentration area with silicon.

When porous silica seed crystals 4 are placed in a high concentration area with silicon, a porous silica crystal tends to form easily. Porous silica polycrystals are formed in a high concentration area with silicon such as on the bottom of the small vessel, but the product formed is polycrystalline. The bulk material is thus preferably fixed so that it does not contact with the bottom of the small vessel. When the bulk material is fixed without contact with the bottom, only a porous silica single crystal is formed on the surface of the bulk material. While porous polycrystalline silica crystals are formed in a high concentration area with silicon such as on the bottom of the small vessel, the bulk material is not covered with the polycrystals because the bulk material is fixed away from the bottom of the small vessel. A nanosized porous silica composition material formed on the bottom of a small vessel, etc., adheres to the bulk material, wherefrom the porous silica crystals are formed. However, since an amount of the adhering nanosized porous silica composition material is in trace amounts, crystals grow on places distant enough from each other to form a single crystal individually. Therefore, it is particularly a preferable condition for the formation of the porous silica single crystal to form a high concentration area with silicon and fix the bulk material 3 without contact with the small container 2, for example, by the stopper 5 as shown in FIG. 1. When silica fine powder, etc., with high reactivity is placed on the bottom of the reaction vessel in a quantity large enough not to be wholly dissolved, and the bulk material is fixed without contact with the bottom of the reaction vessel, only a porous silica single crystal is formed on the surface of the bulk material as well.

When porous silica seed crystals are added to a high concentration area with silicon, it is preferable because crystal growth is promoted and a large-size single crystal can be obtained in high reproducibility.

Crystallized porous silica crystal is used as a seed crystal. The size of the crystal is not particularly limited, but the crystal is preferably crushed before use. The porous silica crystal is considered to be dissolved after addition to the hydrothermal reaction solution, but it is assumed that maintaining a nanosized crystal structure facilitates the formation of a porous silica crystal based on the crystal structure. When the bulk material is used as a silicon raw material, it is particularly preferable for promoting the formation of the porous silica crystal to add the seed crystals, since a silicon crystal is hard to be formed.

A small vessel used in the formation of a high concentration area with silicon is preferably made of polytetrafluoroethylene after considering that the material has to sustain temperature, the presence of a fluoride ion and the acidic or alkaline conditions as well as contamination with impurity metal ions, but other resin materials can be used as long as sufficient strength is held and harmful substances do not get mixed.

In the present invention, the presence of a fluoride ion in the hydrothermal synthesis vessel is preferable because crystal growth is promoted and a large-size single crystal can be obtained in high reproducibility.

A fluoride ion is not particularly limited as long as the compounds such as hydrogen fluoride, ammonium fluoride, etc., can form a fluoride ion in an aqueous solution. Addition of fluoride allows the synthesis of the porous silica crystal, in which silicon dissolves even in a neutral or acidic solution. Addition of the fluoride ton to an alkaline solution also allows the synthesis of the porous silica crystal.

A concentration of the fluoride ion present in the hydrothermal synthesis vessel is preferably 0.1 to 1.0, more preferably 0.2 to 0.8 in a molar ratio to silicon dioxide dissolved in the vessel. When the molar ratio is below 0.1, the effect of the fluoride addition is insufficient and a large single crystal is difficult to be obtained.

EXAMPLE

Examples are given in the following, but the present invention in not limited thereto.

Example 1

As the bulk material, 1.5 g of fused quartz tube cutouts (outer diameter, 10 mm; wall thickness 1 mm; length, 25 mm), which were fused to smooth the cut surface (no existence of sharp portion) was prepared and fixed in a small vessel with an inner diameter of 12 mm and a height of 25 mm made of polytetrafluoroethylene so that the cutouts did not contact with the bottom of the vessel. 0.01 g of silicalite seed crystal was placed on the bottom of this small vessel.

This small vessel and an aqueous solution of tetra-n-propylammonium hydroxide, which was obtained by diluting a solution of 5.92 g of 25% by mass tetra-n-propylammonium hydroxide aqueous solution with 8.33 g of distilled water and then 0.52 g of 46% hydrofluoric acid was added thereto, were placed in a pressure resistant reaction vessel. The vessel was kept at 200° C. for 720 hours in a hot air circulated constant temperature vessel.

Figure 2:
FIG. 2 is a micrograph showing single crystals, which are formed on the bulk material in Example 1.

The vessel was then cooled with water to an ambient temperature and the bulk material was taken out, thoroughly washed with distilled water and dried at 120° C. Crystalline products were formed on the surface of the bulk material. Polycrystalline blocks were formed on the bottom of the polytetrafluoroethylene small vessel. The crystalline products on the bulk material were MFI type zeolite single crystals and the crystal size was 0.5 to 2.5 mm. A microgram of the obtained crystals is shown in FIG. 2.

Example 2

Eight reaction vessels were similarly setup to carry out the synthesis under similar conditions to Example 1. As a result, MFI type zeolite single crystals were formed in all of the eight reaction vessels.

Comparative Example 1

As the bulk material, 1.5 g of fused quartz tube cutouts (outer diameter, 10 mm; wall thickness 1 mm; length, 25 mm), which were left without fusion-treatment of the cut surface were prepared in a small vessel with an inner diameter of 12 mm and a height of 25 mm made of polytetrafluoroethylene (a part of the bulk material contacting with the bottom of the small vessel).

After 7.27 g of 25% by mass tetra-n-propylammonium hydroxide aqueous solution was diluted with 10.17 g of distilled water, to which 0.63 g of 46% hydrofluoric acid was added, this obtained solution and a small vessel were placed in a pressure resistant reaction vessel, which was kept at 200° C. for 240 hours in a hot air circulated constant temperature vessel.

The vessel was then cooled with water to an ambient temperature and the bulk material was taken out, thoroughly washed with distilled water and dried at 120° C. Crystalline products were formed on a sharp portion of the cut surface of the bulk material surface. Crystalline products on the bulk material were MFI type zeolites. Most of them were single crystals with a crystal size of 0.5 to 1.5 mm, adhering to adjacent ones each other and difficult to be taken out as a single crystal.

Comparative Example 2

After 7.27 g of 25% by mass tetra-n-propylammonium hydroxide aqueous solution was diluted with 10.17 g of distilled water, to which 1.08 g of 46% hydrofluoric acid was added, this solution and 1.5 g of fused quartz cutouts (outer diameter, 10 mm; wall thickness, 1 mm; length, 25 mm) treated with fusion as the bulk material were placed in a pressure resistant reaction vessel, which was kept at 200° C. for 240 hours in a hot air circulated constant temperature vessel.

The vessel was then cooled with water to an ambient temperature and the bulk material was taken out, thoroughly washed with distilled water and dried at 120° C. Crystalline products were not formed on the surface of the bulk material and only unreacted quartz tubes remained.

Comparative Example 3

Eight reaction vessels were set up to perform the synthesis under the condition similar to Comparative example 2. As a result, no crystal was formed in all of the eight reaction vessels, but only quartz tube remained.

Comparative Example 4

As the bulk material, 1.5 g of fused quartz tube cutouts (outer diameter, 10 mm; wall thickness 1 mm; length, 25 mm), which were left without the fusion treatment of the cut surface, were prepared in a small vessel with an inner diameter of 12 mm and a height of 25 mm made of polytetrafluoroethylene, so that the cutouts were fixed without contact with the bottom of the vessel. 0.01 g of slicalite seed crystals were placed on the bottom of this small vessel.

This small vessel and an aqueous solution of tetra-n-propylammonium hydroxide, which was obtained by diluting a solution of 5.92 g of 25% by mass tetra-n-propylammonium hydroxide aqueous solution with 8.33 g of distilled water and then 0.52 g of 46% hydrofluoric acid was added thereto, were placed in a pressure resistant reaction vessel. The pressure resistant reaction vessel was kept at 200° C. for 720 hours in a hot air circulated constant temperature vessel.

The vessel was then cooled with water to an ambient temperature and the bulk material was taken out, thoroughly washed with distilled water and dried at 120° C. Crystalline formed products were concentrated on the sharp portion of the cut surface in the bulk material surface. Polycrystalline blocks were also formed on the bottom of the polytetrafluoroethylene small vessel. The crystalline products on the bulk material were polycrystalline MFI type zeolites.

These results indicate that a large-size single crystal could be obtained in Example 1 without the single crystals adhering to each other on the bulk material surface even under the condition, where many crystals tended to form. On the other hand, crystals were not formed in Comparative example 2, where a high concentration area with silicon was not formed as a partial area inside the hydrothermal synthesis vessel. Moreover, polycrystals were formed on the cut surface in Comparative examples 1 and 4, where as the bulk material, fused quartz cutouts, the out surface of which was left without fusion treatment, was used; and in particular, formed crystals were concentrated on the sharp portion of the out surface to yield polycrystals consisiting of adjacent single crystals adhering to each other even in Comparative example 1, although in Comparative example 1, the amount of formed crystals was expected to be small without using the seed crystal, and so a single crystal was assumed to be formed easier.

INDUSTRIAL APPLICABILITY

The present invention allows effective synthesis of a large-size single crystal suitable for the use of molecular sieves, electronic devices, sensors, etc., by using a general condition for the conventional hydrothermal treatment. It also allows not only the above applications but also the expansion and the diversification of the use of the porous silica crystal. The present invention has a large industrial value.

What is claimed is:

1. A method for manufacturing porous silica crystals through a hydrothermal reaction, comprising:
   preparing a surface-smoothed bulk material comprising a compound containing both silicon and oxygen, a hydrothermal synthesis vessel, a small vessel and porous silica seed crystals;
   placing the small vessel in the hydrothermal synthesis vessel;
   placing the porous silica seed crystals in the small vessel;
   fixing the bulk material so that at least part of it is present in the small vessel; and
   performing the hydrothermal reaction in the hydrothermal synthesis vessel wherein the bulk material is served as a supply source for a part or a whole of the structure composition elements of the porous silica crystals, a higher concentration of silicon is formed inside the small vessel, and the porous silica crystals are formed on the surface of the bulk material.

2. The method for manufacturing the porous silica crystals according to claim 1, wherein the bulk material is fixed without contact with the hydrothermal synthesis vessel or the bottom of the small vessel.

3. The method for manufacturing the porous silica crystals according to claim 1, wherein a fluoride ion is present in the hydrothermal synthesis vessel.

4. The method for manufacturing the porous silica crystals according to claim 1, wherein the smoothed surface of the bulk material is prepared by at least one of melting treatment, polishing treatment and cutting treatment.

5. The method for manufacturing the porous silica crystals according to claim 1, wherein the smoothed surface of the bulk material is prepared by melting treatment.

* * * * *